United States Patent
Saltoun et al.

(10) Patent No.: US 12,080,610 B2
(45) Date of Patent: Sep. 3, 2024

(54) WAVELET SYSTEM AND METHOD FOR AMELIORATING MISREGISTRATION AND ASYMMETRY OF SEMICONDUCTOR DEVICES

(71) Applicant: KLA CORPORATION, Milpitas, CA (US)

(72) Inventors: Lilach Saltoun, Qiriat Ono (IL); Daria Negri, Nesher (IL)

(73) Assignee: KLA Corporation, Milpitas, CA (US)

(*) Notice: Subject to any disclaimer, the term of this patent is extended or adjusted under 35 U.S.C. 154(b) by 856 days.

(21) Appl. No.: 17/044,963

(22) PCT Filed: Sep. 4, 2020

(86) PCT No.: PCT/US2020/049297
§ 371 (c)(1),
(2) Date: Oct. 2, 2020

(87) PCT Pub. No.: WO2021/262208
PCT Pub. Date: Dec. 30, 2021

(65) Prior Publication Data
US 2022/0020649 A1 Jan. 20, 2022

Related U.S. Application Data

(60) Provisional application No. 63/043,828, filed on Jun. 25, 2020.

(51) Int. Cl.
*G03F 7/00* (2006.01)
*G01B 15/00* (2006.01)
*H01L 21/66* (2006.01)

(52) U.S. Cl.
CPC .............. *H01L 22/20* (2013.01); *G01B 15/00* (2013.01); *G03F 7/70633* (2013.01); *G03F 7/70655* (2023.05); *G03F 7/706837* (2023.05)

(58) Field of Classification Search
CPC .......... G03F 7/706837; G03F 7/70633; G06T 2207/20064
See application file for complete search history.

(56) References Cited

U.S. PATENT DOCUMENTS 4,938,600 A * 7/1990 Into ..................... G03F 7/70633
356/400
7,295,695 B1 11/2007 Dayal
(Continued)

FOREIGN PATENT DOCUMENTS

WO 2020167331 A1 8/2020

OTHER PUBLICATIONS

Nakajima et al., Improving the Measurement Algorithm for Alignment, Proceedings of the SPIE, vol. 4344, p. 572-582 (2001). (Year: 2001).*

(Continued)

*Primary Examiner* — Steven Whitesell Gordon
(74) *Attorney, Agent, or Firm* — Hodgson Russ LLP

(57) ABSTRACT

A wavelet-analysis system and method for use in fabricating semiconductor device wafers, the system including a misregistration metrology tool operative to measure at least one measurement site on a wafer, thereby generating an output signal, and a wavelet-based analysis engine operative to generate at least one wavelet-transformed signal by applying at least one wavelet transformation to the output signal and generate a quality metric by analyzing the wavelet-transformed signal.

21 Claims, 7 Drawing Sheets

(56) References Cited

U.S. PATENT DOCUMENTS

| | | |
|---|---|---|
| 7,656,512 B2 | 2/2010 | Mieher et al. |
| 7,804,994 B2 | 9/2010 | Adel et al. |
| 9,490,182 B2 | 11/2016 | Shchegrov et al. |
| 9,927,718 B2 | 3/2018 | Kandel et al. |
| 10,415,963 B2 | 9/2019 | Marciano et al. |
| 10,527,951 B2 | 1/2020 | Yohanan et al. |
| 2011/0202298 A1 | 8/2011 | Izikson et al. |
| 2014/0060148 A1 | 3/2014 | Amit et al. |
| 2015/0323316 A1 | 11/2015 | Shchegrov et al. |
| 2017/0256501 A1 | 9/2017 | Chao et al. |
| 2019/0178639 A1* | 6/2019 | Gutman ............... G01B 15/00 |
| 2021/0142457 A1* | 5/2021 | Sugihara ............... G06T 7/12 |

OTHER PUBLICATIONS

Kenneth R. Castleman, Digital Image Processing, 1996, p. 303-319 (Year: 1996).*

Adel et al., "Diffraction order control in overlay metrology: a review of the roadmap options," Metrology, Inspection, and Process Control for Microlithography XXII; Mar. 14, 2008, pp. 692202 (1-19), vol. 6922, SPIE digital Library, USA.

Ausschnitt et al., "Multilayer overlay metrology," Metrology, Inspection, and Process Control for Microlithography XX, Mar. 24, 2006, pp. 615210 (1-10), vol. 6152, SPIE digital library, USA.

Kovesi, "Symmetry and asymmetry from local phase", Tenth Australian joint conference on artificial intelligence, 1997, vol. 190, Australia.

Gonzalez et al., "Digital Image Processing, Chapter 7: Wavelets and Multiresolution Processing", 2002, pp. 349-408, Pearson education—Prentice Hall, New Jersey, USA.

WIPO, ISR for PCT/US2020/049297, Mar. 23, 2021.

\* cited by examiner

WAVELET SYSTEM AND METHOD FOR AMELIORATING MISREGISTRATION AND ASYMMETRY OF SEMICONDUCTOR DEVICES

REFERENCE TO RELATED APPLICATIONS

Reference is hereby made to U.S. Provisional Patent Application Ser. No. 63/043,828, filed Jun. 25, 2020 and entitled WAVELET BASED OVERLAY (OVL) CALCULATIONS AND ASYMMETRY EXTRACTION, the disclosure of which is hereby incorporated by reference and priority of which is hereby claimed.

Reference is also made to the following patents and patent applications of the Applicant, which are related to the subject matter of the present application, the disclosures of which are hereby incorporated by reference:

U.S. Pat. No. 7,656,512 entitled METHOD FOR DETERMINING LITHOGRAPHIC FOCUS AND EXPOSURE;

U.S. Pat. No. 7,804,994 entitled OVERLAY METROLOGY AND CONTROL METHOD;

U.S. Pat. No. 9,490,182 entitled MEASUREMENT OF MULTIPLE PATTERNING PARAMETERS;

U.S. Pat. No. 9,927,718 entitled MULTI-LAYER OVERLAY METROLOGY TARGET AND COMPLIMENTARY OVERLAY METROLOGY MEASUREMENT SYSTEMS;

U.S. Pat. No. 10,415,963 entitled ESTIMATING AND ELIMINATING INTER-CELL PROCESS VARIATION INACCURACY;

U.S. Pat. No. 10,527,951 entitled COMPOUND IMAGING METROLOGY TARGETS;

PCT Application No. PCT/US2019/035282, filed Jun. 4, 2019 and entitled MISREGISTRATION MEASUREMENTS USING COMBINED OPTICAL AND ELECTRON BEAM TECHNOLOGY; and PCT Patent Application No. PCT/US2019/051209, filed Sep. 16, 2019 and entitled PERIODIC SEMICONDUCTOR DEVICE MISREGISTRATION METROLOGY SYSTEM AND METHOD.

FIELD OF THE INVENTION

The present invention relates to measurement of misregistration in the manufacture of semiconductor devices generally.

BACKGROUND OF THE INVENTION

Various methods and systems are known for measurement of misregistration in the manufacture of semiconductor devices.

SUMMARY OF THE INVENTION

The present invention seeks to provide improved methods and systems for measurement of misregistration in the manufacture of semiconductor devices.

There is thus provided in accordance with a preferred embodiment of the present invention a wavelet-analysis system for use in fabricating semiconductor device wafers, the system including a misregistration metrology tool operative to measure at least one measurement site on a wafer, thereby generating an output signal, and a wavelet-based analysis engine operative to generate at least one wavelet-transformed signal by applying at least one wavelet transformation to the output signal and generate a quality metric by analyzing the wavelet-transformed signal.

In accordance with a preferred embodiment of the present invention, the misregistration metrology tool is an electron beam misregistration metrology tool. Preferably, the analyzing includes associating particular portions of the wavelet-transformed signal with particular locations within the measurement site.

In accordance with a preferred embodiment of the present invention, the quality metric includes an indication of asymmetry of at least, one of at least one individual structure formed within the measurement site, at least one group of structures formed within the measurement site and the measurement site.

In accordance with another preferred embodiment of the present invention, the quality metric includes an indication of misregistration between a first layer and a second layer formed on the wafer.

Preferably, the quality metric is operative to be used in a generation of at least one adjusted fabrication parameter. Preferably, the at least one adjusted fabrication parameter is used in the fabricating the semiconductor device wafers.

There is also provided in accordance with another preferred embodiment of the present invention a wavelet-analysis method of fabricating semiconductor device wafers, the method including providing a first wafer, forming, using a first set of fabrication parameters, at least a first layer on the wafer, forming, using a second set of fabrication parameters, at least a second layer on the wafer, subsequently generating an output signal by measuring a measurement site on the first wafer using a misregistration metrology tool, generating at least one wavelet-transformed signal by applying at least one wavelet transformation to the output signal, generating a quality metric by analyzing the wavelet-transformed signal, generating at least one adjusted set of fabrication parameters by adjusting, at least partially based on the quality metric, at least one fabrication parameter, the at least one fabrication parameter being selected from at least one of the first set of fabrication parameters and the second set of fabrication parameters and subsequently forming at least one layer on at least one of the first wafer and a second wafer using the adjusted set of fabrication parameters.

In accordance with a preferred embodiment of the present invention, the wavelet transformation is a continuous wavelet transformation. Preferably, the analyzing includes associating particular portions of the wavelet-transformed signal with particular locations within the measurement site.

In accordance with a preferred embodiment of the present invention, the quality metric includes an indication of misregistration between the first layer and the second layer.

In accordance with a preferred embodiment of the present invention, the generating the wavelet-transformed signal further includes selecting a range of frequencies of which the wavelet-transformed signal is a function, assigning a value of zero to coefficients of the wavelet transformation which correspond to frequency values outside of the range of frequencies.

Alternatively, in accordance with a preferred embodiment of the present invention, the generating the wavelet-transformed signal further includes selecting a range of frequencies of which the wavelet-transformed signal is a function, multiplying coefficients of the wavelet transformation which correspond to frequency values outside of the range of frequencies by a weighting factor.

In accordance with a preferred embodiment of the present invention, the range of frequencies includes frequencies corresponding to at least one dimension of at least one structure formed with at least one of the first layer and the second layer.

Alternatively, in accordance with a preferred embodiment of the present invention, the range of frequencies does not include frequencies corresponding to at least one dimension of at least one structure formed on the wafer. In accordance with a preferred embodiment of the present invention, the at least one structure is formed together with at least one of the first layer and the second layer. Alternatively, in accordance with a preferred embodiment of the present invention, the at least one structure is formed together with a structure layer, the structure layer being a layer other than the first layer and the second layer.

In accordance with a preferred embodiment of the present invention, the quality metric includes an indication of asymmetry of at least one of at least one individual structure formed within the measurement site, at least one group of structures formed within the measurement site and the measurement site.

In accordance with a preferred embodiment of the present invention, the analyzing the wavelet-transformed signal includes identifying a demarcation of general symmetry within the wavelet-transformed signal and identifying at least one pair of asymmetric portions of the wavelet-transformed signal, each of the at least one pair of asymmetric portions including a pair of portions of the wavelet-transformed signal which is not symmetric about the demarcation of general symmetry.

In accordance with a preferred embodiment of the present invention, the analyzing the wavelet-transformed signal includes analyzing a signal having units identical to units of the wavelet-transformed signal. Alternatively, in accordance with a preferred embodiment of the present invention, the analyzing the wavelet-transformed signal further includes analyzing a signal having units identical to units of the output signal.

In accordance with a preferred embodiment of the present invention, the method also includes removing at least one of the first layer and the second layer from the wafer, the at least one layer replaces the at least one of the first layer and the second layer. Alternatively, in accordance with a preferred embodiment of the present invention, the at least one layer does not replace either of the first layer and the second layer.

BRIEF DESCRIPTION OF THE DRAWINGS

The present invention will be understood and appreciated more fully from the following detailed description, taken in conjunction with the drawings in which.

DETAILED DESCRIPTION OF PREFERRED EMBODIMENTS

Figure 1:
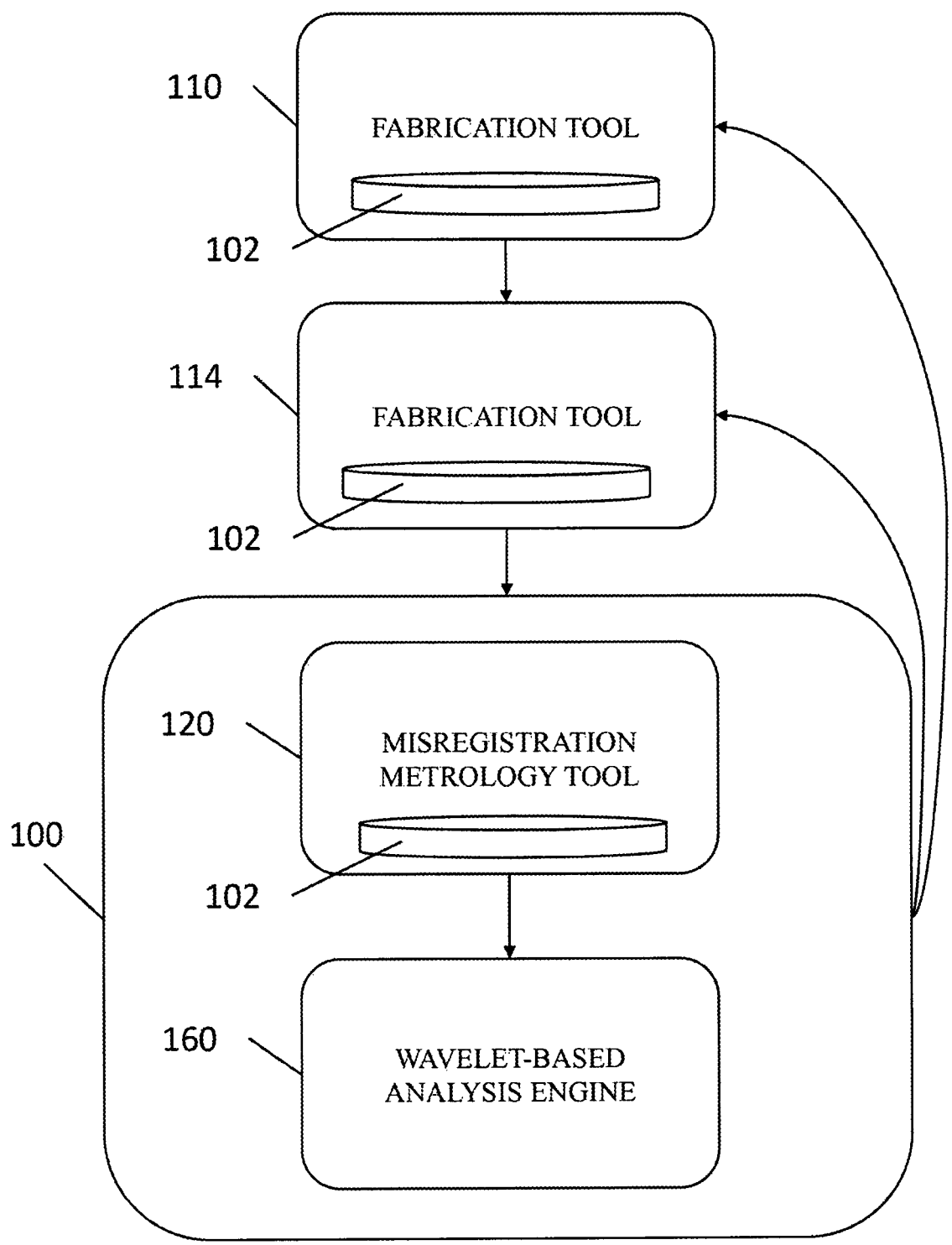
FIG. 1 is a simplified schematic diagram of a wavelet-analysis system for use in the manufacture of semiconductor devices on a wafer.
Figure 2A:
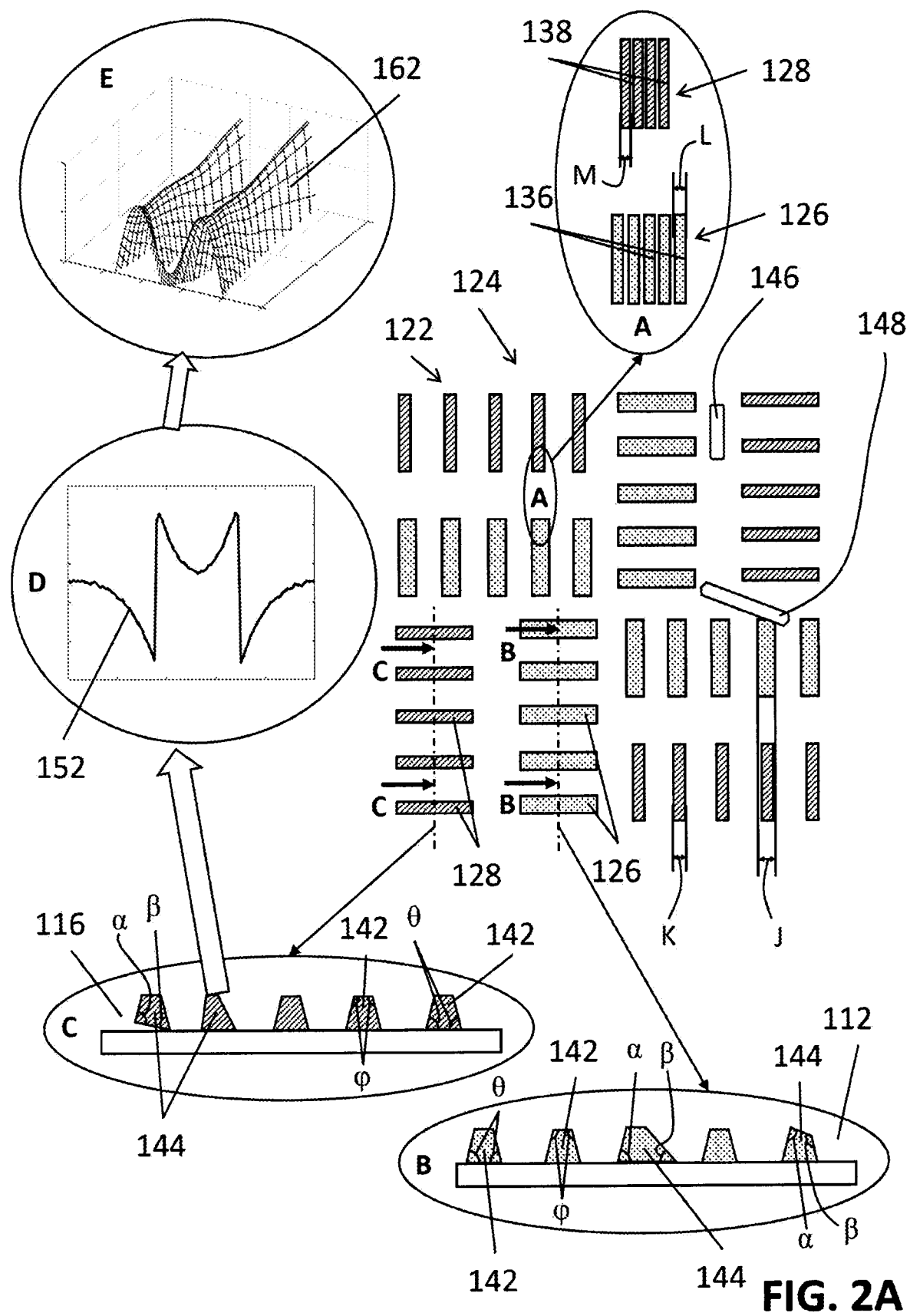
FIG. 2A is a simplified illustration of a conventional measurement site, including a conventional target, suitable for use in the wavelet-analysis system of FIG. 1.
Figure 2B:
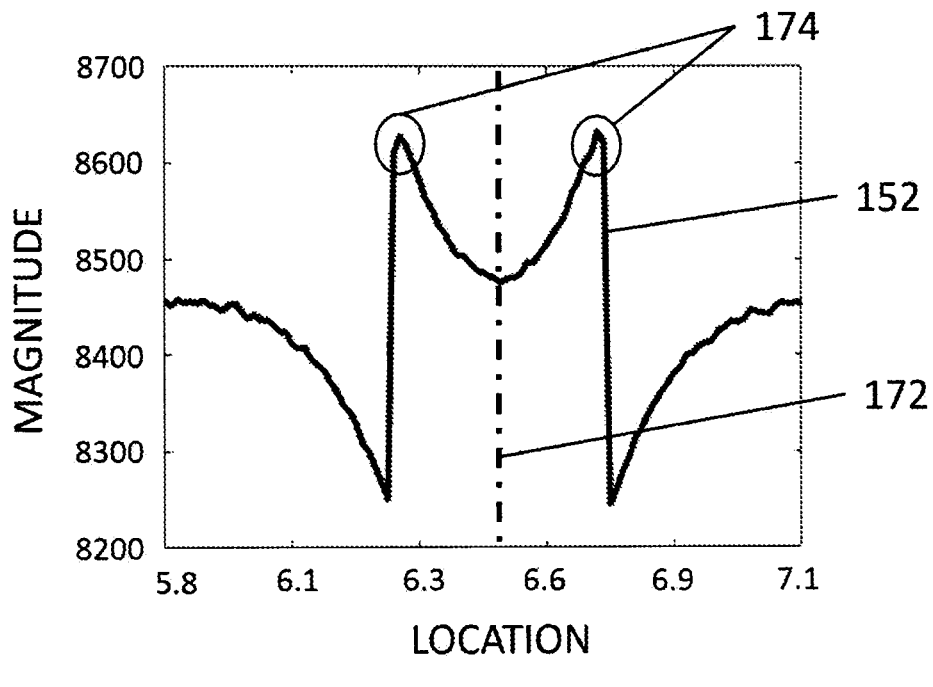
FIG. 2B is a simplified illustration of a conventional output signal generated by a misregistration metrology tool from a portion of the target shown in FIG. 2A, and is an enlargement corresponding to enlargement circle D in FIG. 2A.
Figure 2C:
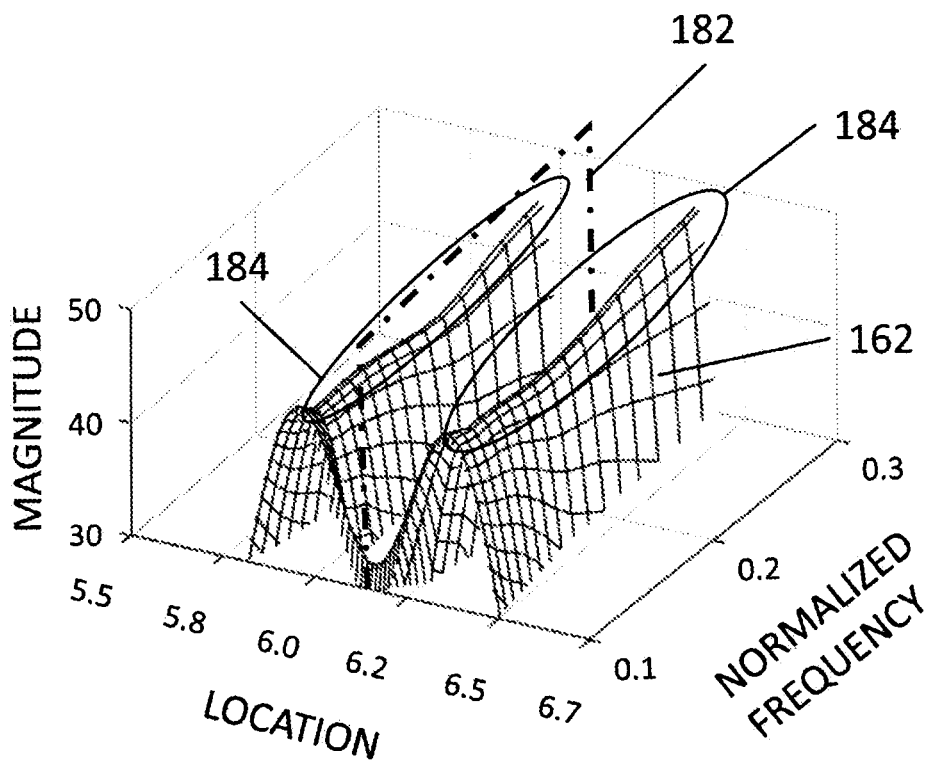
FIG. 2C is a simplified illustration of a wavelet-transformed signal generated by the wavelet-analysis system of FIG. 1 from a portion of the target shown in FIG. 2A, and is an enlargement corresponding to enlargement circle E in FIG. 2A.

Reference is now made to FIG. 1, which is a simplified schematic diagram of a wavelet-analysis system 100 for use in the manufacture of semiconductor devices on a wafer 102 or a on a wafer similar thereto, and to FIG. 2A, which is a simplified illustration of a measurement site suitable for use in the wavelet-analysis system of FIG. 1, to FIG. 2B, which is a simplified illustration of a conventional output signal generated by a portion of the measurement site shown in FIG. 2A, and to FIG. 2C, which is a simplified illustration of a wavelet-transformed signal generated by a portion of the measurement site shown in FIG. 2A.

As seen particularly in FIGS. 1 & 2A, wavelet-analysis system 100 is preferably used in conjunction with a fabrication tool 110 having adjustable fabrication parameters, which preferably uses at least a first set of fabrication parameters to at least partially form a first layer 112 on wafer 102. Wavelet-analysis system 100 is preferably additionally used in conjunction with a fabrication tool 114 having adjustable fabrication parameters, which preferably uses at least a second set of fabrication parameters to at least partially form a second layer 116 on wafer 102. It is appreciated that first layer 112 and second layer 116 may be adjacent layers but need not be, and may be separated by a height ranging from 100 nm to over 10 µm.

In a preferred embodiment of the present invention, examples of fabrication parameters in the first and second sets of fabrication parameters include, inter alia, fabrication parameters identified by a modelling package, such as a K-T Analyzer platform, commercially available from KLA Corporation of Milpitas, CA, USA.

Fabrication tools 110 and 114 may be embodied as any suitable fabrication tools, including, inter alia, a lithography scanner, and etching tool and a polishing tool. In a preferred embodiment of the present invention, fabrication tools 110 and 114 are lithography scanners and are embodied as one or both of immersion scanners and extreme ultra-violet (EUV) scanners. A typical immersion scanner useful as fabrication tool 110 or 114 is an NSR-S635E, commercially available from Nikon Corporation of Tokyo, Japan.

It is appreciated that in one embodiment of the present invention, fabrication tool 110 and fabrication tool 114 are a single tool. In another embodiment of the present invention, fabrication tool 110 and fabrication tool 114 are separate tools. In the embodiment wherein fabrication tools 110 and 114 are separate tools, fabrication tools 110 and 114 may be of the same class of tool, e.g., both photolithographic tools, or of different classes of tool, e.g., a photolithographic tool and a nano-imprint lithographic tool.

Typically, additional layers are formed on wafer 102 in addition to first layer 112 and second layer 116. Preferably, structures are formed with the additional layers. In some embodiments of the present invention, wavelet-analysis system 100 may be operative to measure misregistration between at least one of the additional layers and at least one other layer formed on wafer 102, the at least one other layer being embodied as first layer 112, second layer 116 or another one of the additional layers formed on wafer 102.

Wavelet-analysis system 100 preferably includes a misregistration metrology tool 120, which measures at least one of a plurality of measurement sites 122 on wafer 102. Misregistration metrology tool 120 may be any suitable misregistration metrology tool, including, inter alia, an electron beam misregistration metrology tool. A typical electron beam misregistration metrology tool useful as misregistration metrology tool 120 is an eDR7380™, commercially available from KLA Corporation of Milpitas, CA, USA.

Preferably, any material between misregistration metrology tool 120 and each of first and second layers 112 and 116 is at least partially transparent to electromagnetic radiation used by misregistration metrology tool 120 to measure measurement site or sites 122 on wafer 102.

In one embodiment of the present invention, each of measurement sites 122 on wafer 102 includes structures formed therewithin intended to be identical to structures formed within other ones of measurement sites 122 on wafer 102. In another embodiment of the present invention, each of measurement sites 122 on wafer 102 includes structures formed therewithin intended to differ from structures formed within other ones of measurement sites 122 on wafer 102. In yet an additional embodiment of the present invention, measurement sites 122 in at least a first group of measurement sites on wafer 102 each include structures formed therewithin intended to be identical to structures formed within other ones of measurement sites 122 on wafer 102, while measurement sites 122 in at least a second group of measurement sites on wafer 102 each include structures therewithin intended to differ from structures within other ones of measurement sites 122 on wafer 102.

As seen particularly in the embodiment of one of measurement sites 122 shown in FIG. 2A, measurement site 122 preferably includes at least one target 124 formed therewithin. Target 124 is preferably suitable for measurement by misregistration metrology tool 120. Target 124 generally includes first structures 126 formed together with first layer 112 and second structures 128 formed together with second layer 116.

In a preferred embodiment of the present invention, target 124 is particularly suited for measurement by misregistration metrology tool 120. For example, target 124 may be embodied as a target particularly suited for measurement by an electron-beam misregistration metrology tool and misregistration metrology tool 120 may be embodied as an electron-beam misregistration metrology tool. However, in an additional embodiment of the present invention, target 124 is particularly suited for measurement by a misregistration metrology tool other than misregistration metrology tool 120. For example, target 124 may be embodied as a target particularly suited for measurement by an imaging misregistration metrology tool, and misregistration metrology tool 120 may be embodied as an electron-beam misregistration metrology tool. Preferably, in such a case, misregistration metrology tool 120 can generate a meaningful measurement output even from such a target 124.

For simplicity, target 124 is shown in FIG. 2A as being an advanced imaging metrology (AIM) target. However, target 124 may be embodied as any suitable target, such as, inter alia, a box-in-box target, such as a target similar to targets described in U.S. Pat. No. 7,804,994; an AIM in-die (AIMid) target, such as a target similar to targets described in U.S. Pat. No. 10,527,951; a micro-blossom target, such as a target similar to targets describe in C. P. Ausschnitt, J. Morningstar, W. Muth, J. Schneider, R. J. Yerdon, L. A. Binns, N. P. Smith, "Multilayer overlay metrology," Proc. SPIE 6152, Metrology, Inspection, and Process Control for Microlithography XX, 615210 (24 Mar. 2006); a combined optical and electron beam target, such as a target similar to targets described in PCT Application No. PCT/US2019/035282; and a target useful in measuring misregistration between three or more layers, such as a target similar to targets described in U.S. Pat. No. 9,927,718. Additionally, target 124 may be embodied as complete or partial semiconductor devices intended to be functional semiconductor devices, such as those described in PCT Patent Application No. PCT/US2019/1051209.

Each of first structures 126 are typically intended to each have an identical smallest dimension J, though in some embodiments, different ones of first structures 126 are intended to have a smallest dimension J whose value intentionally differs from smallest dimension J of other ones of first structures 126. As seen in FIG. 2A, smallest dimension J is preferably a width of structure 126 measured from a top planar perspective. Similarly, second structures 128 are typically intended to each have an identical smallest dimension K, though in some embodiments, different ones of second structures 128 are intended to have a smallest dimension K whose value intentionally differs from smallest dimension K of other ones of second structures 128. As seen in FIG. 2A, smallest dimension K is preferably a width of structure 128 measured from a top planar perspective.

In some embodiments of the present invention, as seen particularly in enlargement circle A, each of first structures 126 is formed of first sub-structures 136, each having a smallest dimension L. As seen in enlargement circle A, smallest dimension L is preferably a width of sub-structure 136 measured from a top planar perspective. In other embodiments of the present invention, first structures 126 are generally unitary structures, and do not include sub-structures.

Similarly, in some embodiments of the present invention, as seen particularly in enlargement circle A, each of second structures 128 is formed of second sub-structures 138, each having a smallest dimension M. As seen in enlargement circle A, smallest dimension M is preferably a width of sub-structure 138 measured from a top planar perspective. In other embodiments of the present invention, second structures 128 are generally unitary structures, and do not include sub-structures.

Typically, structures 126 and 128 and sub-structures 136 and 138 are typically intended to be symmetric; however, some or all of structures 126 and 128 and sub-structures 136 and 138 may exhibit unintentional asymmetry. Types of unintentional, asymmetry of structures 126 and 128 and sub-structures 136 and 138 include, inter alia angle asymmetry within a structure.

In the embodiment illustrated in FIG. 2A, structures 126 and 128 and sub-structures 136 and 138 of target 124 are intended to be symmetric structures, such as symmetric structures 142. As seen particularly in enlargement circles B and C, each of symmetric structures 142 preferably include a pair of angles $\theta$ and a pair of angles $\varphi$. Preferably, in each symmetric structure 142, angles $\theta$ generally equal each other and angles $\varphi$ generally equal each other.

However, due to unintentional angle asymmetry, at least some of structures 126 and 128 and sub-structures 136 and 138 of target 124 are asymmetric structures, such as asymmetric structures 144. A seen particularly in enlargement circles B and C, each of asymmetric structures 144 include at least a pair of angles $\alpha$ and $\beta$, where angle $\alpha$ is not generally equal to angle $\beta$.

It is appreciated that in the embodiment shown in FIG. 2A, as seen particularly in enlargement circles B and C, cross-sections of structures 126 and 128 are intended to be isosceles trapezoids, with two identical upper angles and two identical lower angles. Similarly, in the embodiment shown in FIG. 2A, cross-sections of sub-structures 136 and 138 (not shown) are intended to be isosceles trapezoids, with two identical upper angles and two identical lower angles. Thus, pairs of angles α and φ and pair of angles α and β are embodied as either two lower angles or two upper angles within structure 142 or 144, respectively. However, in other embodiments of the present invention, other angles may be intended to be identical, and pairs of angles θ and φ and pair of angles α and β are embodied as whichever angles are intended to be identical, such as two side angles.

Similarly, even when target 124 is intended to be symmetric, target 124 may exhibit unintentional symmetry. Types of unintentional symmetry of target 124 include, inter alia, pitch walk, as described in U.S. Pat. No. 9,490,182; height, width or other variations between structures in target 124, as described in U.S. Pat. No. 7,656,512; and pad-to-pad variations, as described in U.S. Pat. No. 10,415,963. Additionally, measurement site 122 may contain one or more asymmetric structures such as a trench 146 or a portion of extraneous material 148.

Upon measuring measurement site 122, misregistration metrology tool 120 generates an output signal 152, as seen in enlargement circle D. It is appreciated that for ease of understanding, output signal 152 is shown for simplicity as being a 2-dimensional signal; however, output signal 152 may have any suitable number of dimensions.

It is further appreciated that the embodiment of output signal 152 shown in FIG. 2A includes data relating to only a single asymmetric structure 144. However, in other typical embodiments of the present invention, output signal 152 may include data relating to the entirety of measurement site 122 or to any portion thereof.

In one embodiment of the present invention, output signal 152 is in the form of raw data, the raw data being three-dimensional data in a Euclidian x-y-z coordinate system. The three-dimensional data is preferably characterized by a readily apparent one-to-one correspondence between each location in an x-y plane of the x-y-z coordinate system and a location within measurement site 122.

In the embodiment of the present invention shown in enlargement circle D of FIG. 2A, output signal 152 is in the form of adjusted data. Such adjusted data may be, inter alia, a kernel, which is preferably generated from the three-dimensional data in a Euclidian x-y-z coordinate system. For each point on an x-axis of the x-y-z coordinate system, values along a y-axis at that x-value are combined to generate a single y-value for that x-value. The y-axis values may be combined, inter alia, by averaging the y-axis values. The data in the kernel is preferably characterized by a readily apparent correspondence between each location on the x-axis and multiple locations within measurement site 122.

In a preferred embodiment of the present invention, output signal 152, generated by misregistration metrology tool 120, is communicated to a wavelet-based analysis engine 160, which applies at least one wavelet transformation to output signal 152, thereby generating at least one wavelet-transformed signal 162, an example of which is shown in enlargement circle E. It is appreciated that for ease of understanding, wavelet-transformed signal 162 is shown as being a 3-dimensional signal; however, wavelet-transformed signal 162 may have any suitable number of dimensions.

It is further appreciated that the embodiment of wavelet-transformed signal 162 shown in FIG. 2A includes data relating to only a single asymmetric structure 144. However, in other typical embodiments of the present invention, wavelet-transformed signal 162 may include data relating to the entirety of measurement site 122 or to any portion thereof.

In a preferred embodiment of the present invention, the wavelet transformation applied by wavelet-based analysis engine 160 to output signal 152 is a continuous wavelet transformation. In another embodiment of the present invention, the wavelet transformation applied by wavelet-based analysis engine 160 to output signal 152 is a discrete wavelet transformation.

As is known in the art, wavelet transformations are a convolution of a signal with a series of wavelet functions. Because each wavelet function in the series of wavelet functions returns non-zero values for only a finite interval, particular portions of wavelet-transformed signal 162 may be readily associated with corresponding portions of output signal 152. Thus, particular portions of wavelet-transformed signal 162 may be readily associated with particular locations within measurement site 122.

In one embodiment of the present invention, such as the embodiment seen particularly in FIGS. 2B and 2C, the relationship between particular portions of wavelet-transformed signal 162 and particular locations within measurement site 122 may differ from the relationship between particular portions of output signal 152 and particular locations within measurement site 122. In another embodiment of the present invention, the relationship between particular portions of wavelet transformed signal 162 and particular locations within measurement site 122 may be the same as the relationship between particular portions of output signal 152 and particular locations within measurement site 122.

Wavelet-based analysis engine 160 preferably analyzes wavelet-transformed signal 162, thereby generating a quality metric. Wavelet-based analysis engine 160 preferably communicates the quality metric to at least one of fabrication tool 110 and fabrication tool 114, for the adjustment of at least one fabrication parameter of the first set of fabrication parameters, used in the formation of first layer 112, and the second set of fabrication parameters, used in the formation of second layer 116.

It is a particular feature of the present invention that since particular portions of wavelet-transformed signal 162 can be readily associated with corresponding locations within measurement site 122, the quality metric generated by wavelet-based analysis engine 160 can be readily associated with corresponding locations within measurement site 122. Thus, wavelet-analysis system 100 identifies contributions of particular locations or particular ones of structures 126 and 128 and sub-structures 136 and 138 within measurement site 122 to the quality metric, and adjusts at least one parameter of at least one of the first set of fabrication parameters and the second set of fabrication parameters accordingly.

In one embodiment of the present invention, the quality metric generated by wavelet-based analysis engine 160 is a misregistration value, which preferably indicates a misregistration between first layer 112 and second layer 116. In another embodiment of the present invention, the quality metric generated by wavelet-based analysis engine 160 is an indication of asymmetry of at least one of structures 126, structures 128, sub-structures 136, sub-structures 138, target 124 and misregistration site 122. The asymmetry indicated by such an indication of asymmetry may include, inter alia, angle asymmetry within a structure; pitch walk; height, width or other variation between structures in target 124; pad-to-pad variations; and asymmetric structures within measurement site 122 such as one or more trenches 146 or extraneous material 148.

In a preferred embodiment of the present invention, the quality metric generated by wavelet-based analysis engine 160 is used in an adjustment of at least one of the fabrication parameters of the first set of fabrication parameters used by fabrication tool 110 and the second set of fabrication parameters used by fabrication tool 114 in the production of semiconductor devices formed on wafer 102 or on a different wafer.

In an embodiment wherein the quality metric is a misregistration value, the adjustment of at least one of the fabrication parameters preferably results in improved registration between layers 112 and 116 which are fabricated using the adjusted fabrication parameters, compared to layers 112 and 116 which are fabricated using the fabrication parameters which are not adjusted.

In an embodiment wherein the quality metric is an indication of asymmetry, the adjustment of at least one of the fabrication parameters preferably results in better symmetry of at least one of structures 126, structures 128, sub-structures 136, sub-structures 138, measurement site 122 and target 124 compared to structures 126, structures 128, sub-structures 136, sub-structures 138, measurement site 122 and target 124 which are fabricated using the fabrication parameters which are not adjusted.

Additionally or alternatively, the indication of asymmetry may be used in an adjustment of a misregistration value generated by wavelet-analysis system 100. For example, the indication of asymmetry at a particular measurement site 122 may cause wavelet-analysis system 100 to measure wafer 102 at a different measurement site 122 using misregistration metrology tool 120, thereby generating data useful in generating a misregistration value. Similarly, the indication of asymmetry may be used to select a particular portion of output signal 152 generated by misregistration metrology tool 120 for use in generating a misregistration value. Additionally, the indication of asymmetry may be used in adjusting output signal 152 from misregistration metrology tool 120 and the adjusted output signal may be used to generate a misregistration value.

Additionally or alternatively, the indication of asymmetry may be used in an adjustment of a misregistration value generated by a suitable misregistration metrology tool not part of wavelet-analysis system 100. Examples of suitable misregistration metrology tools include, inter alia, an eDR7380™, an Archer™ 750, or an ATL100™, all of which are commercially available from KLA Corporation of Milpitas, CA, USA. For example, the indication of asymmetry at a particular measurement site 122 may prompt the measurement of wafer 102 at a different measurement site 122 by the suitable misregistration metrology tool, thereby generating data useful in generating a misregistration value. Similarly, the indication of asymmetry may be used to select a particular portion of output signal 152 generated by the suitable misregistration metrology tool for use in generating a misregistration value. Additionally, the indication of asymmetry may be used in adjusting output signal 152 from the suitable misregistration metrology tool and the adjusted output signal may be used to generate a misregistration value.

In a preferred embodiment of the present invention, wavelet-transformed signal 162 and its corresponding misregistration value generated by wavelet-analysis system 100 is relatively free from noise relative to an output signal and a misregistration value generated by conventional tools.

It is appreciated that in one embodiment of the present invention, wavelet-analysis system 100 is used to measure misregistration at a plurality of misregistration sites 122, either on the same wafer 102 or different wafers 102, which are intended to be identical to one another.

Additionally, misregistration values generated by wavelet-analysis system 100 for different ones of a plurality of misregistration sites 122 intended to be identical to one another are typically more similar to one another than are misregistration values generated by conventional systems for different ones of a plurality of misregistration sites 122 intended to be identical to one another. The greater similarity between such misregistration values generated by wavelet-analysis system 100 relative to misregistration values generated by conventional misregistration metrology systems is indicative of the relatively greater accuracy of misregistration values generated by wavelet-analysis system 100 when compared to conventional systems.

As described in more detail hereinbelow with particular reference to FIGS. 2B & 2C, wavelet-transformed signal 162 and corresponding indication of asymmetry generated by wavelet-analysis system 100 has a relatively greater sensitivity to asymmetry than typical output signals and corresponding indications of asymmetry generated by conventional tools.

Reference is now made to FIGS. 2B & 2C, which are respectively enlargements of enlargement circles D and E in FIG. 2A, and which respectively show output signal 152 and wavelet-transformed signal 162.

As seen particularly in FIG. 2B, output signal 152 is generally symmetric about an axis of general symmetry 172. Output signal further includes asymmetric signal portions 174, which are not symmetric about axis of general symmetry 172; however, the asymmetry of portions 174 is not readily apparent.

In contrast, as seen particularly in FIG. 2C, wavelet-transformed signal 162 includes a plane of general symmetry 182 and asymmetric signal portions 184. As is readily apparent from a visual inspection of wavelet-transformed signal 162, asymmetric signal portions 184 are not symmetric about plane of general symmetry 182.

Thus, wavelet-transformed signal 162 and a corresponding indication of asymmetry generated by wavelet-analysis system 100 have a greater sensitivity to asymmetry within measurement site 122 relative to conventional output signal 152 and corresponding indications of asymmetry generated by conventional tools.

Figure 3:
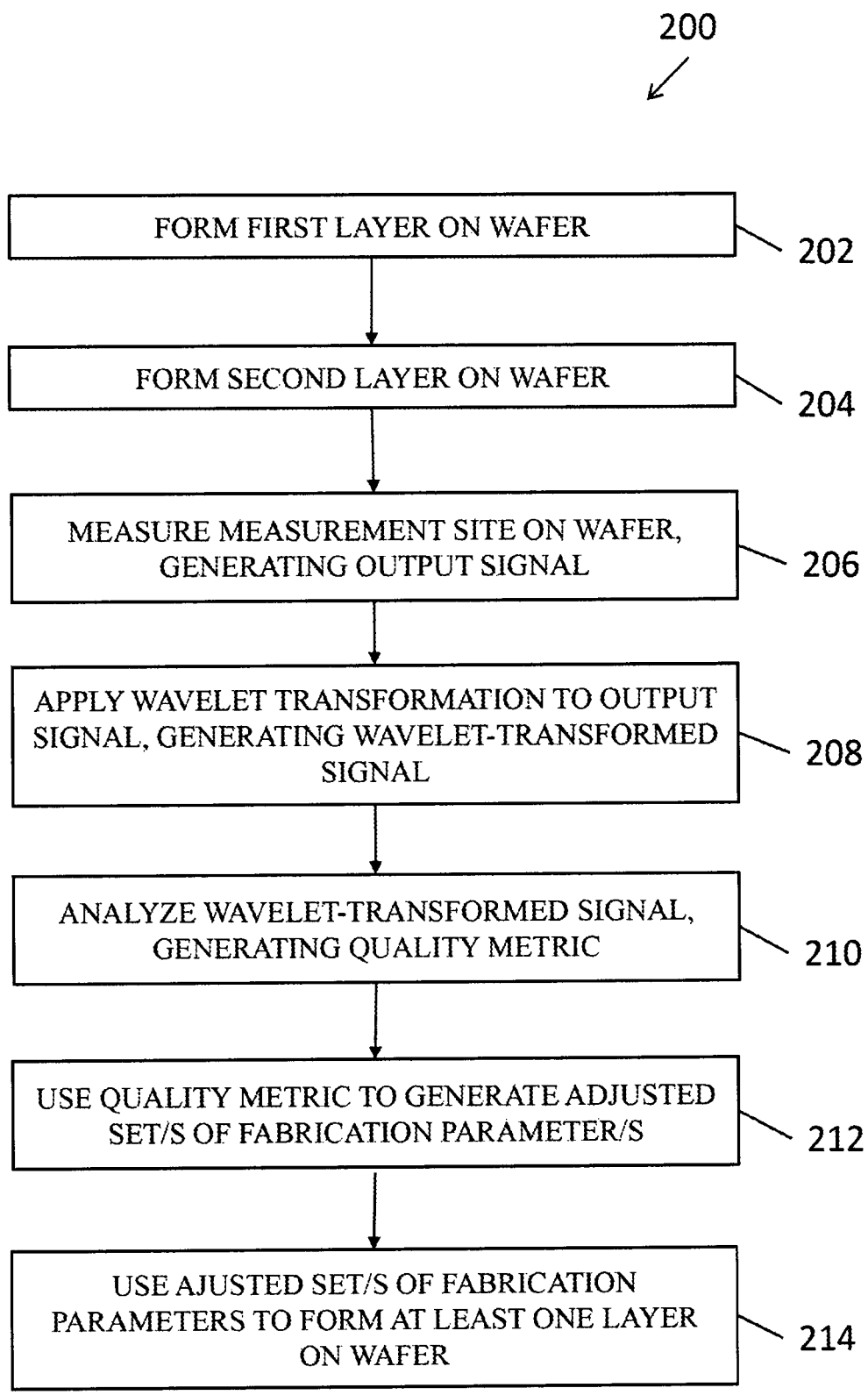
FIG. 3 is a simplified flowchart illustrating a wavelet-analysis method for use by the wavelet-analysis system of FIGS. 1-2C.

Reference is now additionally made to FIG. 3, which is a simplified flowchart illustrating a wavelet-analysis method 200 for use by wavelet-analysis system 100.

As seen in FIG. 3, at a first step 202 of wavelet-analysis method 200, fabrication tool 110 preferably uses at least a first set of fabrication parameters to at least partially form first layer 112 on wafer 102. At a next step 204, fabrication tool 114 preferably uses at least a second set of fabrication parameters to at least partially form second layer 116 on wafer 102.

As noted above, fabrication tool 110 and fabrication tool 114 may be embodied as a single tool or as separate tools. Also as noted above, first layer 112 and second layer 116 may be adjacent layers but need not be, and may be separated by a height ranging from 100 nm to over 10 μm.

At a next step 206, misregistration metrology tool 120 preferably measures at least one measurement site 122 on wafer 102, thereby generating output signal 152.

At a next step 208, output signal 152 generated at step 206 is communicated to wavelet-based analysis engine 160, which preferably applies at least one wavelet transform to output signal 152, thereby generating at least one wavelet-transformed signal 162. In a preferred embodiment of the present invention, the wavelet transformation performed at step 208 is a continuous wavelet transformation. In another embodiment of the present invention, the wavelet transformation performed at step 208 is a discrete wavelet transformation.

At a next step 210, wavelet-based analysis engine 160 preferably analyzes wavelet-transformed signal 162 generated at step 208, thereby generating a quality metric. In a preferred embodiment of the present invention, the quality metric is an indication of, inter alia, misregistration between first layer 112 and second layer 116, as described in more detail hereinbelow with reference to FIGS. 4A & 4B, or asymmetry present within measurement site 122, as described in more detail hereinbelow with reference to FIG. 5.

At a next step 212, wavelet-based analysis engine 160 preferably generates at least one adjusted set of fabrication parameters by adjusting, at least partially based on the quality metric generated at step 210, at least one fabrication parameter. Preferably, the at least one fabrication parameter is selected from at least one of the first set of fabrication parameters used by fabrication tool 110 at step 202 and the second set of fabrication parameters used by fabrication tool 114 at step 204.

At a next step 214, the at least one adjusted set of fabrication parameters generated at step 212 is preferably used in the production of semiconductor devices formed on Wafer 102 or on a different wafer. Preferably, the adjusted parameters are used to form at least one layer on at least one of wafer 102 and an additional wafer. In one embodiment of the present invention, at least one of first layer 112 and second layer 116 are removed from wafer 102, and the at least one layer formed using the adjusted parameters replaces at least one of first layer 112 and second layer 116. In another embodiment of the present invention, neither of first layer 112 and second layer 116 are removed from wafer 102, and the at least one layer formed using the adjusted parameters is formed either above or below first layer 112 and second layer 116.

In an embodiment wherein the quality metric is a misregistration value, the adjustment of at least one of the fabrication parameters at step 212 preferably results in improved registration between layers 112 and 116 fabricated using the adjusted parameters, compared to layers 112 and 116 fabricated using the fabrication parameters which are not adjusted.

In an embodiment wherein the quality metric is an indication of asymmetry, the adjustment of at least one of the fabrication parameters at step 212 preferably results in better symmetry of at least one of structures 126, structures 128, sub-structures 136, sub-structures 138, measurement site 122 and target 124 fabricated using the adjusted fabrication parameters, compared to structures 126, structures 128, sub-structures 136, sub-structures 138, measurement site 122 and target 124 fabricated using the fabrication parameters which are not adjusted. Additionally or alternatively, as described hereinbelow with particular reference to FIG. 5, the indication of asymmetry may be used in an adjustment of a misregistration value.

Figure 4A:
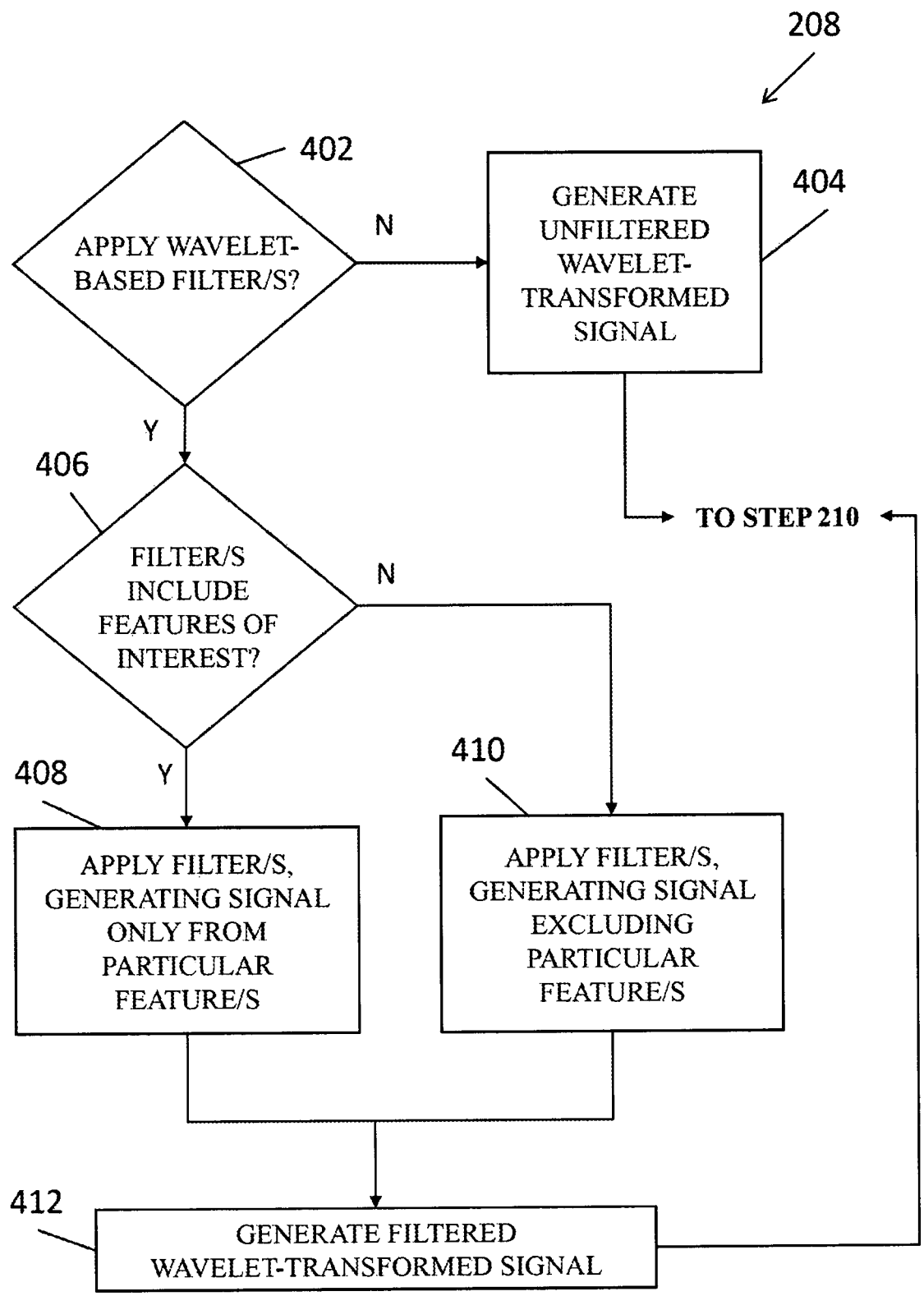
FIGS. 4A & 4B are simplified flowcharts illustrating an embodiment of a portion of the wavelet-analysis method of FIG. 3.

Reference is now additionally made to FIG. 4A, which is a simplified flowchart illustrating an embodiment of step 208 of wavelet-analysis method 200 wherein the quality metric generated at step 210 is an indication of misregistration between first layer 112 and second layer 116.

As seen in FIG. 4A, at a first sub-step 402, a decision is made whether or not to apply one or more wavelet-based filters during the wavelet-transform which generates wavelet-transformed signal 162 at step 208. Such a wavelet-based filter is preferably embodied as a range of frequencies of which wavelet-transformed signal 162 is a function. As is known in the art, wavelet-transformed signal 162 includes inputs from a plurality of coefficients of the wavelet-transformation used at step 208.

In a preferred embodiment of the present invention, when the wavelet-based filter or filters are applied, a value of zero is assigned to all coefficients of the wavelet transformation which correspond to frequency values outside of the range of frequencies of the wavelet-based filter. Thus, when one or more wavelet-based filters are applied, all non-zero values of wavelet-transformed signal 162 generated at step 208 are associated only with frequencies within the range of frequencies of the wavelet-based filter or filters.

In an additional embodiment of the present invention, when the wavelet-based filter or filters are applied, all coefficients of the wavelet transformation which correspond to frequency values outside of the range of frequencies of the wavelet-based filter are multiplied by a weighting factor. Preferably, the weighting factor is greater than zero and less than one. Thus, when one or more wavelet-based filters are applied, contributions from frequencies not included within the range of frequencies of the wavelet-based filter or filters, to wavelet-transformed signal 162 generated at step 208 are suppressed.

If wavelet-based filters are not to be applied, the method proceeds to a next sub-step 404 and generates an unfiltered wavelet-transformed signal. The method then proceeds to step 210 of FIG. 3. If one or more wavelet-based filters are to be applied, the method instead proceeds to a next sub-step 406. At sub-step 406, a decision is made whether or not the one or more wavelet-based filters include structures of interest.

If the wavelet-based filter or filters are to include structures of interest, the method proceeds to a next sub-step 408, at which one or more wavelet-based filters which include structures of interest are selected and applied. In one preferred embodiment of the present invention, wavelet-based filters which include structures of interest are embodied as a range of frequencies which corresponds to at least one of dimensions J, K, L and M of respective structures 126 and 128 and sub-structures 136 and 138. In another preferred embodiment of the present invention, particularly if a structure of interest is part of a group of periodic structures, wavelet-based filters which include structures of interest are embodied as a range of frequencies which corresponds to a pitch of the periodic structures.

Preferably, the relationship between a given frequency in the range of frequencies and a pitch or dimension within measurement site 122, such as one of dimensions J, K, L and M of respective structures 126 and 128 and sub-structures 136 and 138, is an inverse relationship. It is appreciated that there may be many suitable values for a scaling factor relating a given frequency in the range of frequencies to a dimension within measurement site 122. For example, a suitable frequency for inclusion in the range of frequencies of the wavelet-based filter of sub-step 408 may be equal to, inter alia, 1/J, 10/J, 0.5/K, 4/K, 0.1/M, 3.14159/M, 6/L, 0.7/L or 1/L.

If the wavelet-based filter or filters are not to include structures of interest, the method proceeds to a next sub-step 410, at which one or more wavelet-based filters which exclude particular structures are selected and applied. In one preferred embodiment of the present invention, the wavelet-based filters which exclude particular structures suppress contributions to wavelet-transformed signal 162 from at least one of structures 126 and 128 and sub-structures 136 and 138. In such a case, the wavelet-based filters are embodied as at least one range of frequencies which does not correspond to at least one of dimensions J, K, L and M of respective structures 126 and 128 and sub-structures 136 and 138. In another preferred embodiment of the present invention, particularly if the wavelet-based filter applied at sub-step 410 is intended to suppress contributions to wavelet-transformed signal 162 from at least one structure which is part of a group of periodic structures, the wavelet-based filter or filters which exclude particular structures are embodied as a range of frequencies which each correspond to a pitch of the periodic structures to be excluded.

Additionally or alternatively, the wavelet-based filters which exclude particular structures suppress contributions to wavelet-transformed signal 162 from a structure or structures formed on wafer 102 together with layers other than layers 112 or 116. In such a case, the wavelet-based structures are embodied as at least one range of frequencies which does not correspond to at least one pitch or dimension of at least one structure formed on wafer 102 with layers other than layers 112 or 116.

Preferably, the relationship between a given frequency in the range of frequencies and a pitch or dimension within measurement site 122, such as one of dimensions J, K, L and M of respective structures 126 and 128 and sub-structures 136 and 138, is an inverse relationship. It is appreciated that there may be many suitable values for a scaling factor relating a given frequency in the range of frequencies to a dimension within measurement site 122. For example, a suitable frequency for inclusion in the range of frequencies of the wavelet-based filter of sub-step 410 may be equal to, inter alia, 1/J, 10/J, 0.5/K, 4/K, 0.1/M, 3.14159/M, 6/L, 0.7/L or 1/L.

Whether one or more filters which include or exclude particular structures were applied at sub-steps 408 and 410 respectively, the method proceeds to a next sub-step 412, at which a filtered wavelet-transformed signal is generated. It is appreciated that the filtered wavelet-transformed signal generated at sub-step 412 either emphasizes, in the case of sub-step 408, or removes, in the case of sub-step 410, contributions of particular structures of interest to output signal 152 of step 206. Following sub-step 412, the method continues with step 210 of FIG. 3.

Figure 4B:
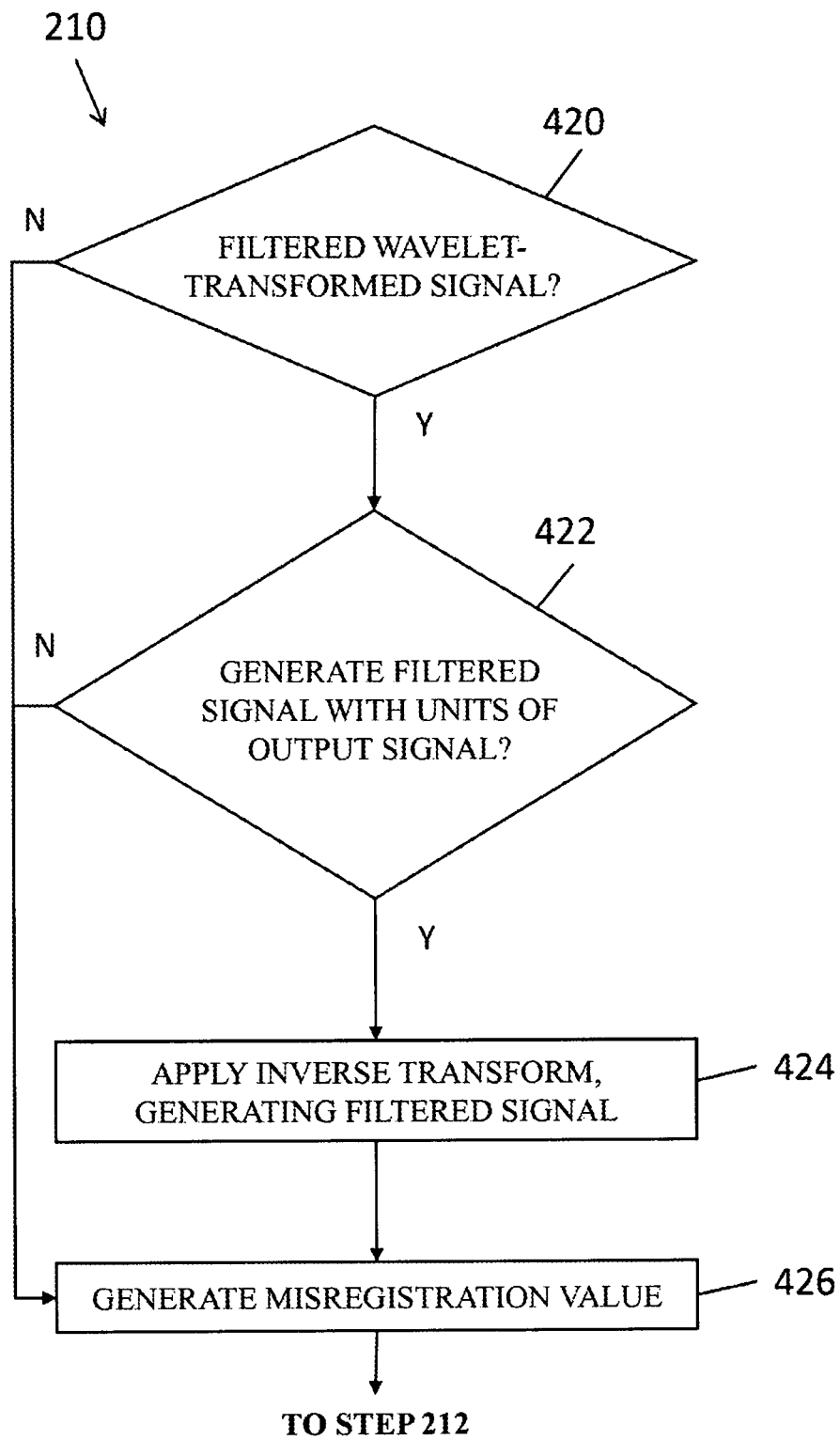

Reference is now additionally made to FIG. 4B, which is a simplified flowchart illustrating an embodiment of step 210 of wavelet-analysis method 200 wherein the quality metric generated at step 210 is an indication of misregistration between first layer 112 and second layer 116.

As seen in FIG. 4B, at a first sub-step 420, an assessment is made to ascertain if wavelet-transformed signal 162 generated at step 208 is a filtered wavelet-transformed signal, such as a wavelet-transformed signal generated at sub-step 412, or an unfiltered wavelet-transformed signal, such as a wavelet-transformed signal generated at sub-step 404.

If wavelet-transformed signal 162 generated at step 208 is a filtered wavelet-transformed signal, the method proceeds to a next sub-step 422, at which a decision is made whether or not to generate a filtered signal having units which are identical to units of output signal 152. If the decision is made to generate a filtered signal having units which are identical to the units of output signal 152, the method proceeds to a next sub-step 424. At sub-step 424, an inverse transform is applied to the filtered wavelet-transformed signal generated at step 208, thereby generating a filtered signal useful in generating a misregistration value. In a preferred embodiment of the present invention, the inverse transform applied at sub-step 424 is a mathematical inverse of the wavelet-transform applied at step 208. In another embodiment of the present invention, the inverse transform applied at sub-step 424 is not the mathematical inverse of the wavelet-transform applied at step 208.

If at sub-step 420, wavelet-transformed signal 162 is ascertained to be an unfiltered wavelet-transformed signal, or if at sub-step 422, the decision is made not to generate a filtered signal having units which are identical to the units of output signal 152, or following sub-step 424, the method proceeds to a next sub-step 426. At sub-step 426, a misregistration value, indicating a misregistration between first layer 112 and second layer 116, is generated. After sub-step 426, the method continues with step 212 of FIG. 3. It is appreciated that in one embodiment of the present invention, the misregistration value generated at sub-step 426 is generated by analyzing a signal having units which are identical to units of wavelet-transformed signal 162, such as wavelet-transformed signal 162 generated at step 208. In another embodiment of the present invention, the misregistration value generated at sub-step 426 is generated by analyzing a signal having units which are identical to the units of output signal 152, such as the filtered signal generated at sub-step 424.

Figure 5:
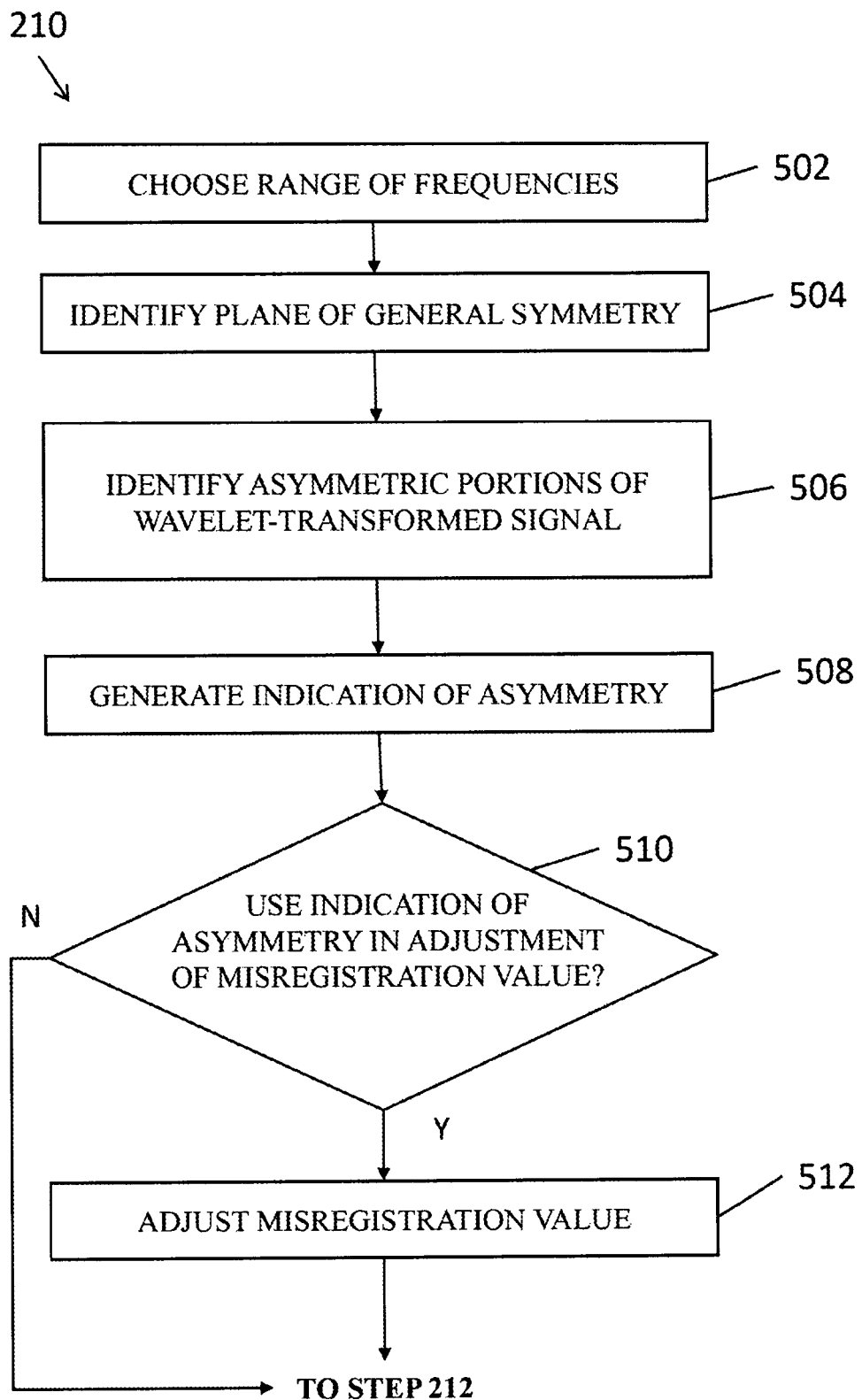
FIG. 5 is a simplified flowchart illustrating an additional embodiment of a portion of the wavelet-analysis method of FIG. 3.

Reference is now additionally made to FIG. 5, which is a simplified flowchart illustrating an embodiment of step 210 of wavelet-analysis method 200 wherein the quality metric generated at step 210 is an indication of asymmetry present within measurement site 122.

As seen in FIG. 5, at a first sub-step 502 a range of frequencies and locations within which to examine wavelet-transformed signal 162 generated at step 208 is chosen. For example, wavelet-transformed signal 162 of FIG. 2C is examined for the range of locations from approximately 5.5 μm-6.7 μm and a range of normalized frequencies from 0.1-0.3 cycles/sample, even though wavelet-transformed signal 162 may include non-zero data for location and frequency values outside of those ranges.

At a next sub-step 504, a demarcation of general symmetry is identified, such as plane of general symmetry 182 of FIG. 2C. It is appreciated that although for simplicity a plane of general symmetry is shown in FIGS. 2C & 5, the identified demarcation of general symmetry may have any suitable form and any suitable number of dimensions.

Then, at a following sub-step 506, at least one pair of asymmetric portions of wavelet-transformed signal, such as asymmetric portions 184 of wavelet-transformed signal 162, are identified. At a following sub-step 508, an indication of asymmetry is generated. It is appreciated that in one embodiment of the present invention, the indication of asymmetry generated at sub-step 508 is generated by analyzing a signal having units which are identical to the units of wavelet transformed signal 162, such as wavelet-transformed signal 162 generated at step 208. In another embodiment of the present invention, the indication of asymmetry generated at sub-step 508 is generated by analyzing a signal having units which are identical to the units of output signal 152, for example by performing an inverse transformation on wavelet-transformed signal 162, in a manner similar to the operation performed at sub-step 424.

At a next sub-step 510, a decision is made whether or not to use the indication of asymmetry generated at sub-step 508 in an adjustment of a misregistration value generated either by wavelet-analysis system 100 or a different suitable misregistration metrology system, as described hereinabove with reference to FIGS. 1-2C.

If the indication of asymmetry generated at sub-step 508 is to be used in an adjustment of a misregistration value, the method proceeds to sub-step 512 and adjusts the misregistration value. For example, the indication of asymmetry generated at sub-step 508 may prompt the measurement of wafer 102 at a different measurement site 122, thereby generating data useful in generating an adjusted misregistration value. Similarly, the indication of asymmetry generated at sub-step 508 may be used to select a particular portion of output signal 152 generated at step 206 for use in generating an adjusted misregistration value. Additionally, the indication of asymmetry generated at sub-step 508 may be used in adjusting output signal 152 generated at step 206, and the adjusted output signal may be used to generate an adjusted misregistration value.

Following sub-step 512, or directly following sub-step 510 if the indication of asymmetry generated at sub-step 508 is not to be used in an adjustment of a misregistration value, the method continues with step 212 of FIG. 3.

It will be appreciated by persons skilled in the art that the present invention is not limited to what has been particularly shown and described hereinabove. The scope of the present invention includes both combinations and subcombinations of various features described, hereinabove as well as modifications thereof, all of which are not in the prior art.

The invention claimed is:

1. A wavelet-analysis system for use in fabricating semiconductor device wafers, the system comprising:
a misregistration metrology tool operative to measure at least one measurement site on a wafer, thereby generating an output signal; and
a wavelet-based analysis engine operative to:
generate at least one wavelet-transformed signal by applying at least one wavelet transformation to said output signal; and
generate a quality metric by analyzing said wavelet-transformed signal, wherein said analyzing comprises associating particular portions of said wavelet-transformed signal with particular locations within said measurement site, and wherein said analyzing further associates contributions of one or more structures formed within said measurement site to said quality metric.

2. The wavelet-analysis system according to claim 1, wherein said misregistration metrology tool is an electron beam misregistration metrology tool.

3. The wavelet-analysis system according to claim 1, wherein said quality metric comprises an indication of asymmetry of at least one of:
at least one individual structure of said structures formed within said measurement site;
at least one group of said structures formed within said measurement site; or
said measurement site.

4. The wavelet-analysis system according to claim 1, wherein said quality metric comprises an indication of misregistration between a first layer and a second layer formed on said wafer.

5. The wavelet-analysis system according to claim 1, wherein said quality metric is operative to be used in a generation of at least one adjusted fabrication parameter.

6. The wavelet-analysis system according to claim 5, wherein said at least one adjusted fabrication parameter is used in said fabricating said semiconductor device wafers.

7. A wavelet-analysis method of fabricating semiconductor device wafers, the method comprising:
providing a first wafer;
forming, using a first set of fabrication parameters, at least a first layer on said wafer;
forming, using a second set of fabrication parameters, at least a second layer on said wafer;
subsequently generating an output signal by measuring a measurement site on said first wafer using a misregistration metrology tool;
generating at least one wavelet-transformed signal by applying at least one wavelet transformation to said output signal;
generating a quality metric by analyzing said wavelet-transformed signal, wherein said analyzing comprises associating particular portions of said wavelet-transformed signal with particular locations within said measurement site, and wherein said analyzing further associates contributions of one or more structures formed within said measurement site to said quality metric;
generating at least one adjusted set of fabrication parameters by adjusting, at least partially based on said quality metric, at least one fabrication parameter, said at least one fabrication parameter being selected from at least one of said first set of fabrication parameters or said second set of fabrication parameters; and
subsequently forming at least one layer on at least one of said first wafer and a second wafer using said adjusted set of fabrication parameters.

8. The wavelet-analysis method according to claim 7, wherein said wavelet transformation is a continuous wavelet transformation.

9. The wavelet-analysis method according to claim 7, wherein said quality metric comprises an indication of misregistration between said first layer and said second layer.

10. The wavelet-analysis method according to claim 9, wherein said generating said wavelet-transformed signal further comprises:
selecting a range of frequencies of which said wavelet-transformed signal is a function; and
assigning a value of zero to coefficients of said wavelet transformation which correspond to frequency values outside of said range of frequencies.

11. The wavelet-analysis method according to claim 10, wherein said range of frequencies comprises frequencies corresponding to at least one dimension of at least one structure formed with at least one of said first layer and said second layer.

12. The wavelet-analysis method according to claim 10, wherein said range of frequencies does not comprise frequencies corresponding to at least one dimension of at least one structure formed on said wafer.

13. The wavelet-analysis method according to claim 12, wherein said at least one structure is formed together with at least one of said first layer or said second layer.

14. The wavelet-analysis method according to claim 12, wherein said at least one structure is formed together with a structure layer, said structure layer being a layer other than said first layer and said second layer.

15. The wavelet-analysis method according to claim 9, wherein said generating said wavelet-transformed signal further comprises:

selecting a range of frequencies of which said wavelet-transformed signal is a function; and multiplying coefficients of said wavelet transformation which correspond to frequency values outside of said range of frequencies by a weighting factor.

16. The wavelet-analysis method according to claim 7, wherein said quality metric comprises an indication of asymmetry of at least one of:

at least one individual structure of said structures formed within said measurement site;

at least one group of said structures formed within said measurement site; or said measurement site.

17. The wavelet-analysis method according to claim 16, wherein said analyzing said wavelet-transformed signal comprises:

identifying a demarcation of general symmetry within said wavelet-transformed signal; and identifying at least one pair of asymmetric portions of said wavelet-transformed signal, each of said at least one pair of asymmetric portions comprising a pair of portions of said wavelet-transformed signal which is not symmetric about said demarcation of general symmetry.

18. The wavelet-analysis method according to claim 7, wherein said analyzing said wavelet-transformed signal comprises analyzing a signal having units identical to units of said wavelet-transformed signal.

19. The wavelet-analysis method according to claim 7, wherein said analyzing said wavelet-transformed signal further comprises analyzing a signal having units identical to units of said output signal.

20. The wavelet-analysis method according to claim 7, further comprising removing at least one of said first layer or said second layer from said wafer, and wherein said at least one layer replaces said at least one of said first layer or said second layer.

21. The wavelet-analysis method according to claim 7, wherein said at least one layer does not replace either of said first layer or said second layer.

\* \* \* \* \*